United States Patent [19]

Doan et al.

[11] Patent Number: 5,767,005
[45] Date of Patent: Jun. 16, 1998

[54] METHOD FOR FABRICATING A FLASH EEPROM

[75] Inventors: Trung Tri Doan; Tyler A. Lowrey, both of Boise, Id.

[73] Assignee: Micron Technology, Inc., Boise, Id.

[21] Appl. No.: 532,997

[22] Filed: Sep. 25, 1995

Related U.S. Application Data

[63] Continuation-in-part of Ser. No. 98,449, Jul. 27, 1993, abandoned.

[51] Int. Cl.$^6$ ............................................. H01L 21/8247
[52] U.S. Cl. ........................... 438/593; 438/258; 438/692
[58] Field of Search ................................. 437/43, 52, 69, 437/228; 438/585, 587, 593, 594, 258, 692

[56] References Cited

U.S. PATENT DOCUMENTS

| | | | |
|---|---|---|---|
| 4,818,725 | 4/1989 | Lichtel, Jr. et al. | 437/203 |
| 4,833,094 | 5/1989 | Kenney | 437/47 |
| 4,997,781 | 3/1991 | Tigelaar | 437/43 |
| 5,032,881 | 7/1991 | Sardo et al. | 357/23.5 |
| 5,196,353 | 3/1993 | Sandhu et al. | 437/8 |
| 5,270,234 | 12/1993 | Huang et al. | 437/44 |
| 5,290,721 | 3/1994 | Yoshimi et al. | 437/43 |
| 5,292,673 | 3/1994 | Shinriki et al. | 437/42 |
| 5,315,142 | 5/1994 | Acovic et al. | 257/316 |
| 5,407,534 | 4/1995 | Thakur | 156/662 |
| 5,521,108 | 5/1996 | Rostoker et al. | 437/43 |

OTHER PUBLICATIONS

Patrick, William J. et al., "Application of Chemical Mechanical Polishing to the Fabrication of VLSI Circuit Interconnections", J. Electrochem Soc., vol. 138, No. 6, Jun. 1991, pp. 1778–1784.

Kaufman, F. B., et al, "Chemical–Mechanical Polishing for Fabricating Patterned W Metal Features as Chip Interconnects", J. Electrochem Soc., vol. 138 No. 11, Nov., 1991, pp. 3460–3465.

*Primary Examiner*—John Niebling
*Assistant Examiner*—Richard A. Booth
*Attorney, Agent, or Firm*—Stephen A. Gratton

[57] ABSTRACT

A method for forming a floating gate semiconductor device such as an electrically erasable programmable read only memory is provided. The device includes a silicon substrate having an electrically isolated active area. A gate oxide, as well as other components of a FET (e.g., source, drain) are formed in the active area. A self aligned floating gate is formed by depositing a conductive layer (e.g., polysilicon) into the recess and over the gate oxide. The conductive layer is then chemically mechanically planarized to an endpoint of the isolation layer so that all of the conductive layer except material in the recess and on the gate oxide is removed. Following formation of the floating gate an insulating layer is formed on the floating gate and a control gate is formed on the insulating layer.

24 Claims, 4 Drawing Sheets

METHOD FOR FABRICATING A FLASH EEPROM

CROSS REFERENCE TO RELATED APPLICATIONS

This application is a continuation-in-part of application Ser. No. 08/098,449 filed Jul. 27, 1993 now abandoned.

FIELD OF THE INVENTION

The present invention relates generally to semiconductor manufacture and specifically to a method for fabricating a semiconductor memory device. More specifically, this invention relates to a method for fabricating a floating gate semiconductor device such as an electrically erasable programmable read only memory device (EEPROM).

BACKGROUND OF THE INVENTION

One type of memory device is known as a programmable read only memory (PROM). This is a nonvolatile memory which maintains the stored data even through periods of no power. In some applications however, it is advantageous to change the instructions or data in a PROM. This requires that the data within the device be erased and the device be electrically reprogrammed with other data. With a UV-EPROM, erasure is accomplished by exposure to UV light for a prolonged time period.

Because it is relatively expensive to reprogram devices using UV light, electrically erasable programmable read only memory devices (EEPROM) have been developed. These devices are also known as flash EEPROMs because the data within the device can be erased using an electrical erase signal. The term flash is used because an array of memory cells can be erased much faster than with a UV-EPROM (e.g., 1 second vs. 20 minutes). Typically, a flash EEPROM includes a control gate and a floating gate which control current flow through a channel region of a MOSFET.

FIG. 1 illustrates a memory array 10 that includes one type of prior art flash EEPROM cell 12. A silicon substrate 14 includes a field oxide (FOX) 16 for isolating active areas 18 formed on the substrate 14. Each EEPROM cell 12 comprises a conventional FET having a source, a drain and a gate region. For simplicity, all of the elements of the EEPROM cells 12 are not shown. However, each EEPROM cell 12 includes a floating gate 20 formed over a gate oxide 24. A control gate 22 forms the word line of the array 10 and is separated from the floating gates 20 by an insulating layer 26. Typically the insulating layer 26 is an oxide/nitride/oxide (ONO) composite film. The floating gate 20 and control gate 22 are typically formed of doped polysilicon.

In operation of the flash EEPROM cell 12, the presence of electrons in the floating gate 20 alters the normal operation of the FET and the flow of electrons between the source and drain of the FET. Programming of the flash EEPROM cell 12 can be accomplished by hot-electron injection into the floating gate 20. The erasing mechanism of the flash EEPROM cell 12 is electron tunneling off the floating gate 20 to the drain region of the FET.

One problem with constructing a prior art memory array 10 in this manner is in forming the floating gates 20. Typically, the floating gates 20 are defined by blanket depositing a layer of polysilicon and then etching the layer in a required pattern with spaces 28 between adjacent EEPROM cells 12. A photolithographic process can be used to etch the floating gates 20. This photolithographic process requires a critical mask formation and alignment step. In order to insure adequate alignment during this step, the floating gates 20 are typically made larger than is necessary. In other words the floating gates 20 must extend over the full thickness of the FOX 16 on either side of the active areas 18 of the array 10. A pitch of the floating gates 20 and the cells 12 is thus increased by the critical mask formation. Furthermore, using this method of formation the floating gates 20 must be made thicker than is necessary to provide a proportional capacitive coupling of the floating gates 20 relative to the control gates 22.

In view of the foregoing, it is an object of the present invention to provide an improved method for forming floating gate MOSFET devices such as flash EEPROMS. It is a further object of the present invention to provide an improved floating gate MOSFET device and an improved flash EEPROM. It is yet another object of the present invention to provide an improved method for forming a floating gate of a semiconductor device in which the floating gate is self aligned and a critical masking step for forming the floating gate is eliminated. It is yet another object of the present invention to provide an improved method for forming a floating gate MOSFET device, such as a flash EEPROM, using chemical mechanical planarization.

Other objects, advantages and capabilities of the present invention will become more apparent as the description proceeds.

SUMMARY OF THE INVENTION

In accordance with the present invention, an improved method for forming a floating gate semiconductor device is provided. The method uses a chemical mechanical planarization (CMP) step to form the floating gate in a location that is self aligned to a gate area of the device.

The method includes forming an active area on a silicon substrate and a gate oxide in the active area. An isolation layer, comprising a field oxide, or other insulating material, is also formed on the substrate in a pattern which forms a recess having sidewalls which surround and enclose the active area. A conductive material is then deposited over the isolation layer, over the sidewalls of the recess, and onto the gate oxide. During the CMP process the conductive material is planarized to a planar endpoint defined by a surface of the isolation layer. In other words, all of the conductive material except for the material within the recess is removed. This remaining material is self aligned with the gate area and forms the floating gate.

In an illustrative embodiment, a flash EEPROM is formed. The flash EEPROM includes a field effect transistor (FET) comprising a source, a drain and a gate oxide. The FET is formed in an active area of the substrate isolated from adjacent active areas within an enclosed recess formed by a field oxide. The flash EEPROM also includes a floating gate formed by depositing a conductive layer (e.g., polysilicon) over the gate oxide and field oxide and then chemically mechanically planarizing the conductive layer to an endpoint of the field oxide. This forms the floating gate in alignment with the gate area of the FET without the requirement of a critical masking step. Following the formation of the floating gate an insulating layer is formed on the floating gate and a control gate is formed on the insulating layer. The control gate also serves as the word line for the device.

In an alternate embodiment of the invention, rather than planarizing the floating gate to an endpoint of the field oxide, the conductive material for the floating gate is initially deposited to a thickness that is less than a depth of the recess formed in the field oxide. This forms the surface of the conductive material in a concave shape which increases an interface area of the floating gate and the control gate and the capacitive coupling between these elements. The capacitive coupling can also be increased by forming the floating gate with a rough surface having an increased surface area. This can be accomplished by forming the floating gate out of a hemispherical grain (HSG) polysilicon.

DETAILED DESCRIPTION OF THE PREFERRED EMBODIMENT

Figure 1:
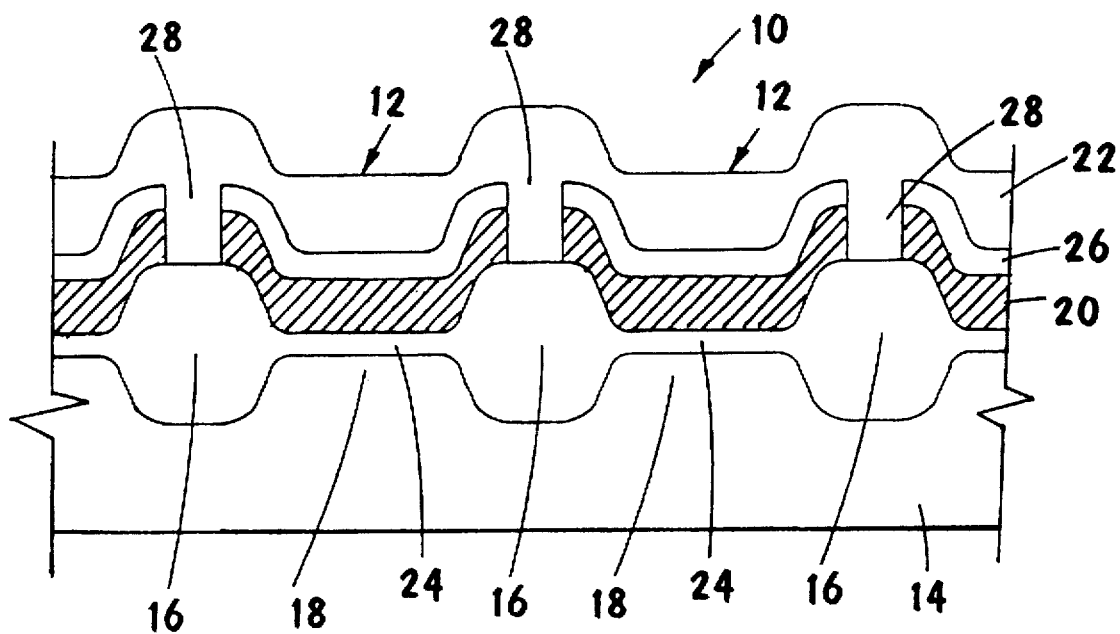
FIG. 1 is a schematic cross sectional view of a prior art memory array that includes prior art flash EEPROM cells.
Figure 2A:
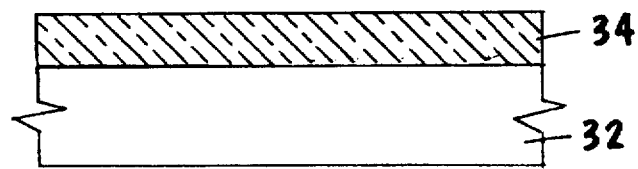
FIGS. 2A-2G are schematic cross sectional views illustrating steps in a method for forming a flash EEPROM cell in accordance with the invention.

Referring now to FIGS. 2A-2G, a method for forming a flash EEPROM semiconductor device is shown. Initially as shown in FIG. 2A, a silicon substrate 32 is formed. An implant step may have previously been performed on the substrate 32 to define different regions. These regions can include various conductivity regions such as n-wells and p-wells (not shown), which can be formed by well known processes to construct elements of a FET transistor (e.g., source, drain, channel region). As also shown in FIG. 2A, an isolation layer 34 is formed on the substrate 32. The isolation layer 34 can be a layer of $SiO_2$ that is grown or deposited on the substrate 32 to a desired thickness (e.g., 200-1000 Å).

Figure 2B:
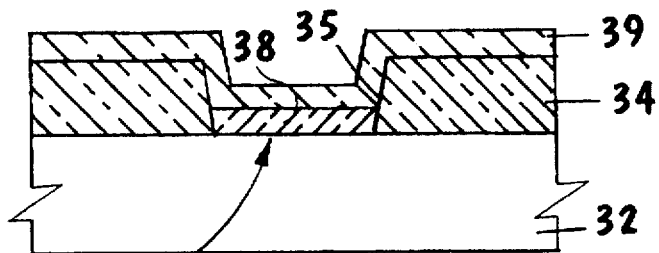

Next, as shown in FIG. 2B, the isolation layer 34 is patterned and etched to form a recess 35. A photolithographic process can be used to form a mask to etch the recess 35. For a $SiO_2$ isolation layer 34, the etch process can be performed with a wet etchant such as HF acid or a dry etch process performed with a chlorine or fluorine etching species. The recess 35 is illustrated as including sloped sidewalls consistent with an etch formation process. The recess 35 completely encloses the active area 36 of the substrate 32 wherein components of the flash EEPROM will be formed. As also shown in FIG. 2B, a pad oxide 38 is formed on the substrate 32 over what will become the channel between the source and drain in the completed EEPROM. As will become apparent, the pad oxide 38 is a sacrificial pre-gate oxide that will be stripped prior to the growth of the actual gate oxide. As also shown in FIG. 2B, a silicon nitride layer 39 is formed over the pad oxide 38 and over the isolation layer 34. The silicon nitride layer 39 will be used to form a mask 40 (FIG. 2C), and a field oxide (FOX) 42 (FIG. 2D), on the substrate 32.

Figure 2C:
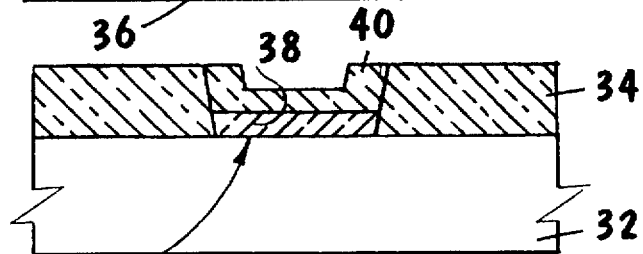

Next, as shown in FIG. 2C, the nitride layer 39 is planarized to form a hard mask 40. The nitride layer 39 is planarized to a planar endpoint that is co-planar to the surface of the isolation layer 34. A preferred method of planarization is chemical mechanical planarization (CMP). Suitable chemical mechanical planarization apparatus are known in the art. One suitable apparatus is manufactured by Westech Engineering and is designated as a Model 372 Polisher. Other CMP apparatus are described in U.S. Pat. Nos. 5,036,015; and 5,142,828. The planarized nitride mask 40 covers just the active areas 36 of the substrate 32. As an alternative to chemical mechanical planarization, the nitride mask 40 can be formed by a photolithographic process as is well known in the art.

Figure 2D:
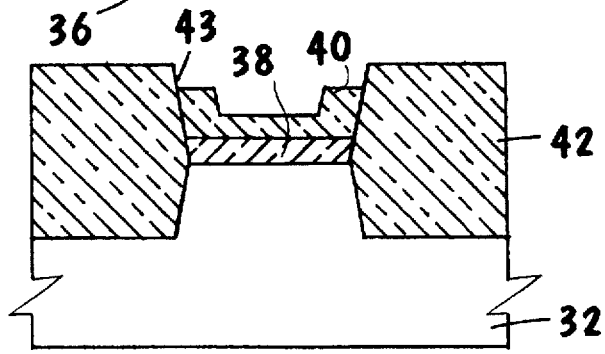

Next, as shown in FIG. 2D, a field oxide (FOX) 42 is formed using the nitride mask 40. Suitable processes for forming the field oxide 42 are well known in the art and are known generally as local oxidation of silicon (LOCOS) processes. As an example, the field oxide 42 can be grown in a wet oxygen atmosphere at about 800° C.–1200° C. for about 6–10 hours. This forms a field oxide 42 that is approximately 2000 Å to 6000 Å thick with a tapered bird's beak area substantially as shown. By growing around the mask 40, the field oxide 42 forms a recess 43 which viewed from above encloses the active area 36 on four sides (e.g., rectangular shaped). The sidewalls of the recess 43 are formed by the outer surfaces of the bird's beak portions of the four sided field oxide 42.

Following formation of the field oxide 42, the substrate 32 is subjected to a local implanted field step or LIF. During the LIF step a field implant dopant is implanted through the field oxide 42 and into the substrate 32 to form isolation field areas on the substrate 32. Implanting of the field dopant can be accomplished using conventional ion implantation equipment. The exact process will depend on the device requirements. As an example, high energy p-type implants (e.g., boron) can be used to define field isolation between n-transistors.

Following the formation of the field oxide 42, the nitride mask 40 is removed using a suitable etchant. By way of example, a solution of $H_3PO_4$ can be used to strip the nitride mask 40. The sacrificial pad oxide 38 is also removed. For a pad oxide 38 formed of silicon dioxide, a wet etch process can be performed using HF acid or a dry etch process can be performed with a chlorine or fluorine etching species.

Figure 2E:
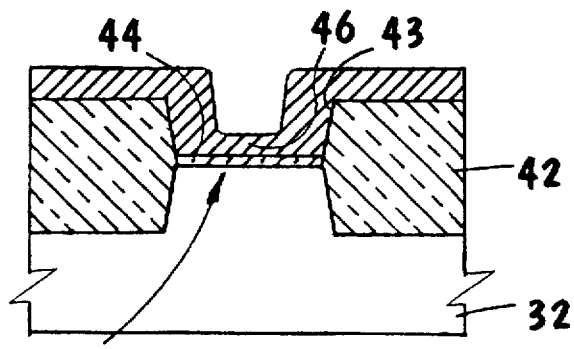

Next, as shown in FIG. 2E, a gate oxide 44 is formed on the substrate 32 in the active area 36. The gate oxide 44 is also referred to in the art as the tunnel oxide. The gate oxide 44 is a very thin layer (e.g., 200–800 Å) of material such as silicon dioxide ($SiO_2$) that can be formed by growth or deposition.

As also shown in FIG. 2E, a conductive layer 46 is blanket deposited over a surface of the field oxide 42 into the recess 43 and over the gate oxide 44. The conductive layer 46 is preferably doped polysilicon deposited by a process such as CVD (termed herein as "Poly 1"). Alternately the conductive layer 46 can be formed of a metal such as titanium, tungsten, tantalum, molybdenum or alloys of these metals.

Figure 2F:
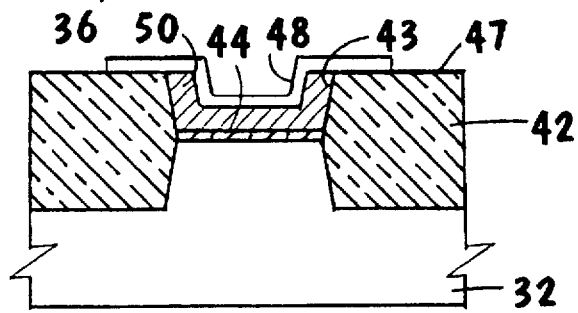

Next, as shown in FIG. 2F, the conductive layer 46 is planarized using chemical mechanical planarization (CMP). Suitable CMP apparatus as previously described, can be used to perform this step. The conductive layer 46 can be planarized to a planar endpoint that is co-planar with the surface 47 of the field oxide 42. This removes all of the conductive layer 46 (FIG. 2E) except for the material within the recess 43 and on the sidewalls of the recess 43. The chemical mechanical planarization (CMP) step can also planarize the surface of the field oxide 42 without detriment. Endpoint detection can be accomplished by techniques that are known in the art such as direct measurement or approximations based on experimental data and known process conditions.

Still referring to FIG. 2F, planarization of the conductive layer 46 (FIG. 2E) forms a self aligned floating gate 50 by removing all of the unwanted conductive layer 46 from the surface of the field oxide 42. Advantageously, a critical masking step is not required to form the floating gate 50 because the unwanted portions of the conductive layer 46 are removed by the planarization process. The peripheral shape of the floating gate 50 is defined by the inner periphery of the recess 43. The floating gate 50 is thus said to be self aligned.

Still referring to FIG. 2F, following planarization of the floating gate 50, a control gate oxide 48 is formed over the floating gate 50. By way of example, the control gate oxide 48 can be silicon dioxide that is grown or deposited on the floating gate 50 to a desired thickness. Following formation of the control gate oxide 48, a mask (not shown) can be formed for removing unwanted portions of the control gate oxide 48. By way of example, the mask can be formed as an oxide/nitride/oxide (ONO) composite using techniques that are known in the art. Open areas of the mask can align with peripheral devices of the memory array that do not require a floating gate. This mask can be described as a non-critical mask because satisfactory alignment of the relatively large areas involved can be effected using techniques that are known in the art. Using the mask, the unwanted portions of the control gate oxide 48 can be removed with a suitable etch process.

Figure 2G:
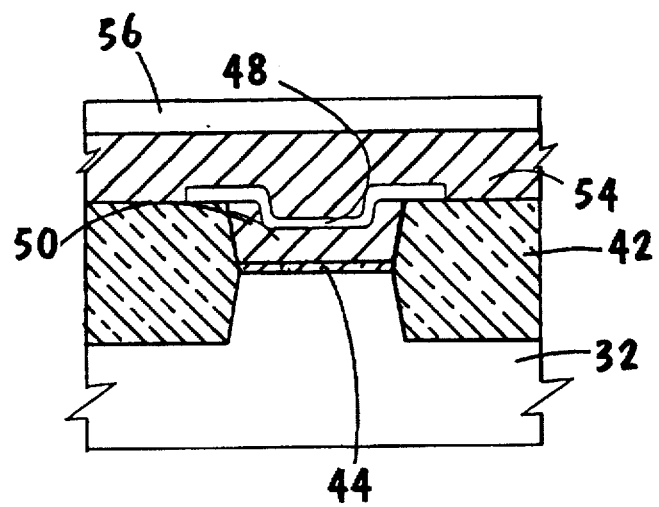

Next, as shown in FIG. 2G, a second conductive layer 54 is deposited over the control gate oxide 48 and over the field oxide 42. The second conductive layer 54 can be a material such as doped polysilicon (termed herein as "poly 2") deposited to a desired thickness using CVD or other suitable deposition process. Other conductive materials such as the previously identified metals can be used to form the second conductive layer 54. The second conductive layer 54 will be patterned to form the control gate and word line to the EEPROM.

Figure 3:
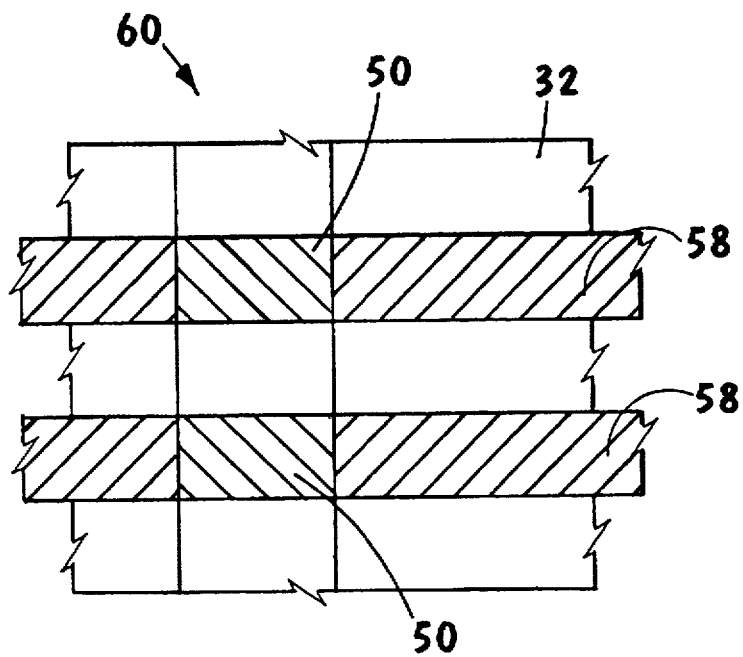
FIG. 3 is a plan view of the flash EEPROM cell constructed as shown in FIGS. 2A-2G.

As also shown in FIG. 2G, an insulating layer 56 is formed over the second conductive layer 54. The insulating layer 56 can be an oxide such as silicon dioxide, or other suitable dielectric material grown or deposited as previously described. Following formation of the insulating layer 56, a photomask (not shown) is formed over the insulating layer 56. The photomask is patterned with openings that permit the insulating layer 56 and the second conductive layer 54 to be etched simultaneously to form word lines 58 (FIG. 3). If desired, the unwanted portions of the floating gates 50 on the peripheral devices can be etched at the same time. As shown in FIG. 3, the completed EEPROM 60 includes floating gates 50 which are subjacent and orthogonal to the word lines 58.

Referring now to FIGS. 4A–4D, a simplified version of the method of the invention is illustrated. Initially a substrate 32A is provided as previously described with an active area 36A. An isolation layer 34A is formed with a recess 43A and, A pad oxide 38A is formed on the substrate 32A in the active area 36A. A conductive layer 46A is formed on the sidewalls of the recess 43A and over the isolation layer 34A and pad oxide 38A. These elements are substantially equivalent to the corresponding elements previously described. In this embodiment the recess 43A is formed with generally vertically oriented sidewalls as would be consistent with an anisotropic etch process.

Figure 4A:
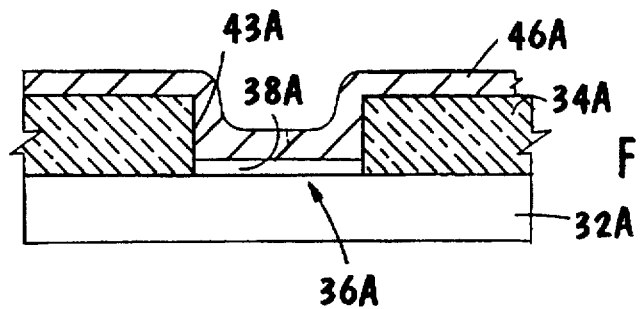
FIGS. 4A-4D are schematic cross sectional views illustrating steps in a method for forming a floating gate semiconductor device in accordance with the invention.
Figure 4B:
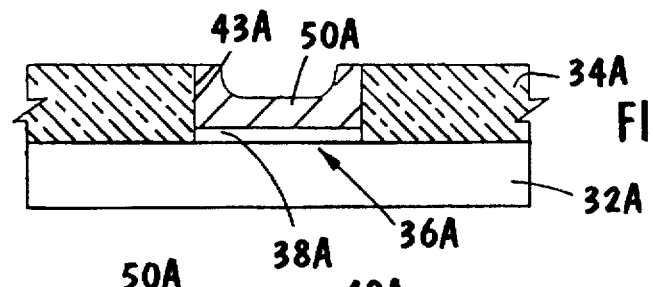

Next, as shown in FIG. 4B, the conductive layer 46A is chemically mechanically planarized to an endpoint of the isolation layer 34A substantially as previously described to form self aligned floating gate 50A.

Figure 4C:
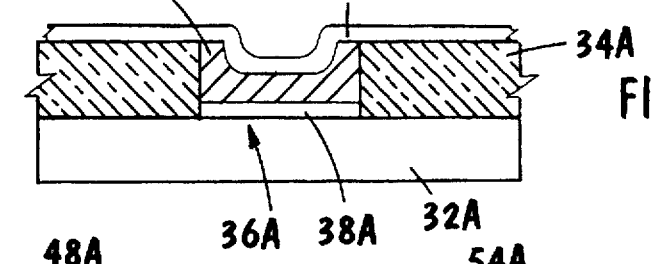

Next, as shown in FIG. 4C, a control gate oxide 48A is formed atop the isolation layer 34A and floating gate 50A.

Figure 4D:
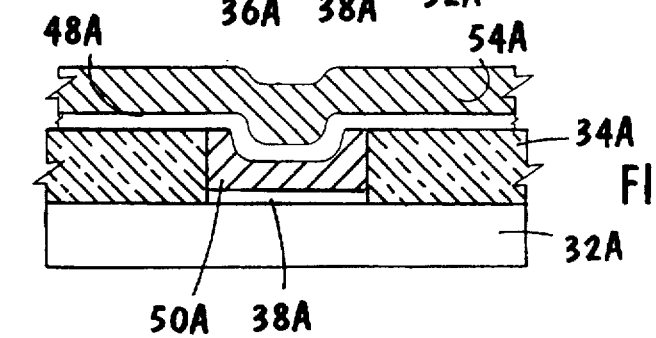

Next, as shown in FIG. 4D, a conductive layer 54A is formed atop the control gate oxide 48A and etched as previously described to form word lines.

Figure 5:
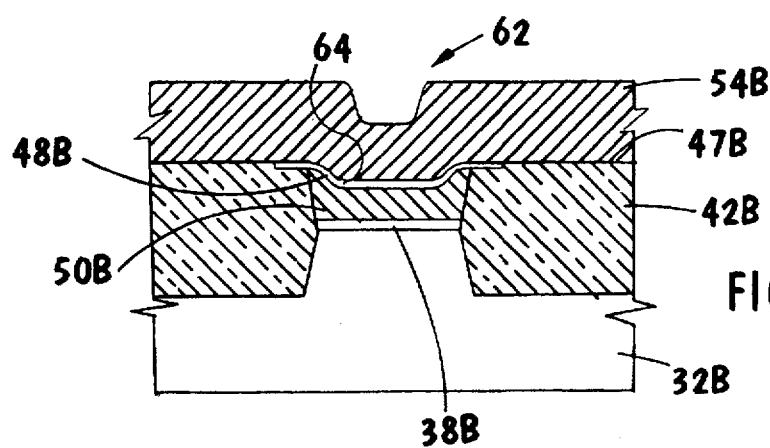
FIG. 5 is a schematic cross sectional view of a floating gate semiconductor device formed in accordance with an alternate embodiment of the invention.

Referring now to FIG. 5, an alternate embodiment EEPROM 62 constructed in accordance with the invention is shown. The alternate embodiment EEPROM 62 includes a substrate 32B, a field oxide 42B and a pad oxide 38B formed substantially as previously described. A floating gate 50B is formed by depositing a conductive material into the active area defined by the inner boundaries of the field oxide 42B. A shape and thickness of the floating gate 50B is determined by control of the deposition process such that the floating gate 50B has a concave surface 64 that is below the upper surface 47B of the FOX 42B. A control gate oxide 48B and conductive layer 54B for the control gate are formed on the floating gate 50B substantially as previously described. The concave surface 64 of the floating gate 50B provides an increased surface area and increased capacitive coupling with the conductive layer 54B which forms the control gate.

A surface area of the floating gate 50B can also be increased by forming the floating gate 50B with a roughened surface 64. One method of forming a roughened surface is by using a hemispherical grain polysilicon to form the floating gate 50B.

Thus the invention provides an improved method for forming floating gate semiconductor devices and an improved flash EEPROM. While the invention has been described with reference to certain preferred embodiments, as will be apparent to those skilled in the art, certain changes and modifications can be made without departing from the scope of the invention as defined by the following claims.

What is claimed is:

1. A method for forming a semiconductor device comprising:

providing a substrate with an active area;

forming a first layer on the substrate, said first layer including a first recess enclosing the active area;

forming a mask in the first recess configured to protect the active area;

forming a field oxide on the first layer using the mask, said field oxide including a second recess aligned with the first recess;

removing the mask;

forming a conductive layer on the field oxide and the second recess; and planarizing the conductive layer to a surface of the field oxide.

2. The method as recited in claim 1 wherein planarizing the conductive layer comprises chemical mechanical planarization (CMP).

3. The method as recited in claim 1 further comprising forming an insulating layer on the conductive layer and then forming a second conductive layer on the insulation layer.

4. The method as recited in claim 1 wherein forming the mask comprises a chemical mechanical planarization step.

5. The method as recited in claim 1 wherein forming the field oxide comprises a local oxidation of silicon process.

6. The method as recited in claim 1 wherein the conductive layer comprises polysilicon.

7. The method as recited in claim 1 wherein the semiconductor device comprises an electrically erasable programmable read only memory.

8. A method for forming a semiconductor device comprising:

providing a silicon substrate with a gate area;

forming a first layer on the substrate, said first layer including a first recess enclosing the gate area;

forming a mask within the first recess;

forming a field oxide on the first layer, said field oxide including a second recess aligned with the first recess, said second recess enclosing the gate area;

removing the mask;

forming a conductive layer on the field oxide, said conductive layer extending into the second recess; and planarizing the conductive layer to a surface of the field oxide to form a floating gate self aligned with the gate area.

9. The method as claimed in claim 8 wherein planarizing the conductive layer comprises chemical mechanical planarization (CMP).

10. The method as claimed in claim 8 further comprising:

forming an insulating layer on the conductive layer; and forming a control gate on the insulating layer.

11. The method as claimed in claim 10 further comprising forming the semiconductor device in a memory array and removing the insulating layer from peripheral devices of the array.

12. The method as claimed in claim 8 wherein the conductive layer comprises doped polysilicon.

13. The method as claimed in claim 8 wherein the conductive layer comprises a metal.

14. The method as claimed in claim 8 wherein the semiconductor device comprises an electrically programmable read only memory.

15. A method for forming a semiconductor device comprising:

providing a silicon substrate with a gate area;

forming a first layer on the substrate, said first layer including a first recess enclosing the gate area;

forming a mask on the gate area;

forming a field oxide on the first layer with the gate area protected by the mask, said field oxide including a second recess enclosing the gate area;

forming a conductive layer on the gate area; and planarizing the conductive layer to a surface of the field oxide to form a floating gate on the gate area.

16. The method as claimed in claim 15 wherein the planarizing step comprises chemical mechanical planarization (CMP).

17. The method as claimed in claim 15 wherein forming the mask comprises depositing a mask layer in the first recess and chemically mechanically planarizing the mask layer to a surface of the first layer.

18. The method as claimed in claim 15 wherein the semiconductor device comprises an electrically erasable programmable read only memory.

19. A method for forming a semiconductor device comprising:

providing a silicon substrate;

forming an isolation oxide on the substrate, said isolation oxide including a first recess;

depositing a mask layer on the isolation oxide and into the first recess;

chemically mechanically planarizing (CMP) the mask layer to a surface of the isolation oxide to form a mask covering the substrate in the first recess;

growing a field oxide on the substrate using the mask, said field oxide including a second recess aligned with said first recess;

removing the mask;

forming a conductive layer on the field oxide and into the second recess;

planarizing the conductive layer to a surface of the field oxide to remove the conductive layer except within the second recess to form a floating gate;

forming an insulating layer on the conductive layer; and forming a control gate on the insulating layer.

20. The method as claimed in claim 19 wherein the mask layer comprises silicon nitride.

21. The method as claimed in claim 19 wherein planarizing the conductive layer comprises chemical mechanical planarization (CMP).

22. The method as claimed in claim 19 wherein the semiconductor device comprises an electrically erasable programmable read only memory.

23. A method for forming an electrically erasable programmable read only memory comprising:

providing a silicon substrate with a gate area;

forming a first layer on the substrate, said first layer including a first recess enclosing the gate area;

depositing a second layer on the first layer and within the first recess;

planarizing the second layer to a surface of the first layer to form a mask within the recess;

growing a field oxide on the second layer with the gate area protected by the mask, said field oxide including a second recess aligned with the first recess, said second recess enclosing and electrically isolating the gate area;

removing the mask;

forming a conductive layer on the field oxide, said conductive layer extending into the second recess; and planarizing the conductive layer to a surface of the field oxide to form a floating gate self aligned with the active area.

24. The method as claimed in claim 23 wherein planarizing the second layer comprises chemical mechanical planarization.

\* \* \* \* \*